United States Patent
Kuklinski et al.

(10) Patent No.: US 11,462,939 B1
(45) Date of Patent: Oct. 4, 2022

(54) HYDROTHERMAL VENT ENERGY HARVESTING, STORAGE, AND POWER DISTRIBUTION SYSTEM

(71) Applicant: The United States of America as represented by the Secretary of the Navy, Newport, RI (US)

(72) Inventors: Robert Kuklinski, Portsmouth, RI (US); Anthony A Ruffa, Hope Valley, RI (US)

(73) Assignee: The United States of America as represented by the Secretary of the Navy

( * ) Notice: Subject to any disclaimer, the term of this patent is extended or adjusted under 35 U.S.C. 154(b) by 329 days.

(21) Appl. No.: 16/937,682

(22) Filed: Jul. 24, 2020

(51) Int. Cl.
| | |
|---|---|
| *F03B 13/26* | (2006.01) |
| *H02J 50/00* | (2016.01) |
| *H02J 7/00* | (2006.01) |
| *F03G 7/05* | (2006.01) |
| *B63B 35/44* | (2006.01) |
| *H01L 35/28* | (2006.01) |

(52) U.S. Cl.
CPC .......... *H02J 50/001* (2020.01); *B63B 35/44* (2013.01); *F03G 7/05* (2013.01); *H02J 7/0013* (2013.01); *B63B 2035/4466* (2013.01); *H01L 35/28* (2013.01)

(58) Field of Classification Search
CPC .......... F03B 13/26; F03B 13/16; F03B 13/24; F03B 13/188; F03B 13/1885; F03B 13/20; F03B 15/00; F03B 13/1845; F03B 13/142; F03B 13/14; F05B 2240/93; F05B 2220/706; F05B 2240/97; F05B 2280/5001; F05B 2260/4031; Y02E 10/38; Y02E 10/32; H02J 50/001; H02J 7/0013; H01L 35/28; F03G 7/05; B63B 2035/4466; B63B 35/44
See application file for complete search history.

(56) References Cited

U.S. PATENT DOCUMENTS

| | | | | |
|---|---|---|---|---|
| 11,002,255 | B2 * | 5/2021 | Lowry | B01D 53/326 |
| 11,156,734 | B1 * | 10/2021 | Raghukumar | H04B 11/00 |
| 2009/0013690 | A1 * | 1/2009 | Marshall | F03G 7/05 60/641.2 |
| 2009/0121484 | A1 * | 5/2009 | Newman | F03D 3/007 290/55 |
| 2020/0182218 | A1 * | 6/2020 | Sheldon-Coulson | H02K 44/085 |
| 2022/0025843 | A1 * | 1/2022 | Sheldon-Coulson | F03B 13/24 |

* cited by examiner

*Primary Examiner* — Shafiq Mian
(74) *Attorney, Agent, or Firm* — James M. Kasischke; Michael P. Stanley

(57) ABSTRACT

An energy harvesting system is positionable at an ocean surface to harvest energy from a hydrothermal vent surrounded by cooler ocean water. The system includes an energy storage device positionable proximate to the ocean surface. A cable capable of conducting electrical energy is joined to the energy storage device. An energy harvesting structure is joined to provide electrical energy to the cable. The energy harvesting structure can be positioned proximate to the hydrothermal vent to harvest energy therefrom.

18 Claims, 4 Drawing Sheets

US 11,462,939 B1

HYDROTHERMAL VENT ENERGY HARVESTING, STORAGE, AND POWER DISTRIBUTION SYSTEM

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

None.

BACKGROUND OF THE INVENTION

(1) Field of the Invention

The present invention is directed to a thermal energy harvesting and distribution system and more particularly to a system utilizing energy from an ocean thermal vent.

(2) Description of the Prior Art

Interest in energy harvesting from ocean thermal vents is ongoing. The high temperatures (e.g., typically around 350° Celsius) of sea-floor hydrothermal vents make them attractive targets for the exploitation of thermal energy that may be used to generate electric power for unmanned underwater vehicles (UUVs). However, the location, depth range, and other physical characteristics of the vents pose challenges to accessibility and practical application of current methods for harvesting, storing, and distributing such energy. For example, the pH of the hydrothermal fluid released from the vents and water in the surrounding area may be as low as 2.8 which can lead to significant corrosion of systems implemented in the harvesting, conversion, and transport of energy that may be used to power UUVs or other suitable devices. Further, fouling is also a serious issue due to the prevalence dissolved minerals within the vicinity of the vent as well the prevalence of naturally occurring tubeworms and other organisms. Fouling on and within current systems may impede or reduce function as well lead to enhanced degradation.

Systems that pump hot vent hydrothermal fluids to a power plant at the water surface have been previously described. However, such systems may not be able to cooperate with UUVs and involve partially capping the vent which can disturb and/or disrupt the local ecosystems.

Similarly, other systems are designed as fixed or anchored structures on and/or around the vent so that a large amount of consumable power can be generated. These stable structures may negatively impact the surrounding biological communities. The above issues have been recognized by the inventors herein.

SUMMARY OF THE INVENTION

A first object is to provide a buoy capable of charging unmanned vehicles above and below a water surface.

Another object is to provide a device that can be repositioned relative to the hydrothermal vent.

Yet another object is to provide a device that does not require blocking the entire thermal vent.

Accordingly, one embodiment provides a hydrothermal vent energy harvesting, storage, and distribution system. This includes a flotation device coupled to an energy storage device. The floatation device and energy storage device is located at or near an ocean surface. The system further comprises an energy harvesting unit coupled to the flotation device via a cable. The energy harvesting unit is positioned near a hydrothermal vent during energy harvesting. The embodiment can further include a positioning system (e.g., via the flotation device and coupled thrusters) so that hydrothermal energy from a vent may be converted to electrical energy using a simple thermal or thermoelectric mechanism employed by the energy harvesting unit. Electrical energy may be transmitted from the energy harvesting unit to the energy storage device via the cable and the energy storage device may distribute power to coupled devices at or near the ocean surface.

In this way, the system can be readily deployed for UUV charging as stable structures are not demanded for the generation of electrical power (e.g., the system may generate power as soon as the energy harvesting unit is in position). Further, the system does not demand the vent be capped or otherwise blocked, thus minimally impacting the surrounding environment (e.g., the energy harvesting unit may be suspended near the vent). Moreover, potential issues arising from corrosion and fouling may be minimized as the system includes few if any moving parts.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Features of illustrative embodiments may be understood from the accompanying drawings in conjunction with the description. The elements in the drawings may not be drawn to scale. Some elements and/or dimensions may be enlarged or minimized for the purpose of illustration and understanding of the disclosed embodiments.

DETAILED DESCRIPTION OF THE INVENTION

The following description relates to systems and methods for hydrothermal vent energy harvesting, storage, and power distribution systems that can be used to charge unmanned underwater vehicles (UUVs) and, more specifically, to charge the UUVs in an environmentally responsible manner. Generally, the system may be mobile, comprised of a simple energy harvesting unit (e.g., having few if any moving parts)

positioned at or near a vent. The energy harvesting unit is physically and operatively coupled to flotation and energy storage or distribution devices located at or near an ocean surface via a cable. The energy harvesting unit may be strategically positioned (e.g., via a buoy and a coupled positioning system) to convert heat energy from the vent into commanded and/or demanded electrical energy, with the electrical energy transferred to the energy storage/distribution devices at the surface via the cable. The energy storage/distribution devices may be communicatively coupled to UUV docking stations, unmanned aerial vehicle docking stations, or other suitable devices that may be used to charge vehicles. In one example, thermal energy at the vent may be converted to electrical energy using the Seebeck effect, with the electrical energy transferred to a bank of batteries that may be used to power docking stations.

Figure 2:
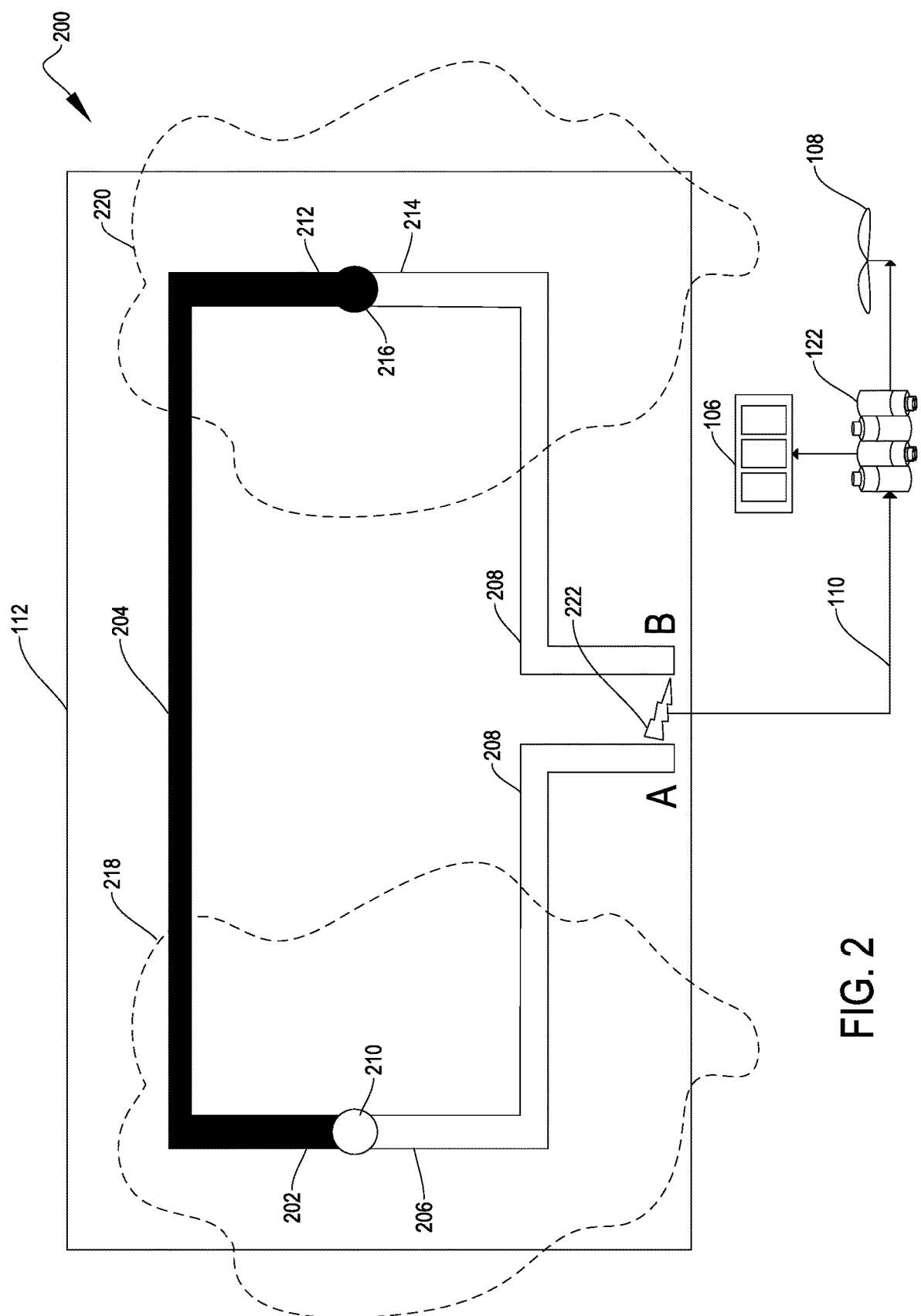
FIG. 2 illustrates the Seebeck effect which may be used to generate thermoelectric power within the system of FIG. 1.

The Seebeck effect, as illustrated in FIG. 2, is a phenomenon in which a temperature difference between two dissimilar electrical conductors or semiconductors produces a voltage difference between the two conductors or semiconductors. When heat is applied to one of the two conductors, heated electrons flow toward the cooler conductor. If the pair of conductors is connected through an electrical circuit, direct current (DC) flows through that circuit. Thus, a thermal harvesting unit may be comprised of "hot" junctions and "cold" junctions connecting two dissimilar metals, where the "hot" junctions are positioned near the vent and the "cold" junctions are positioned away from the vent (e.g., in cooler water than the "hot" junctions) so that a voltage potential is generated that may be used for electrical power.

Figure 1:
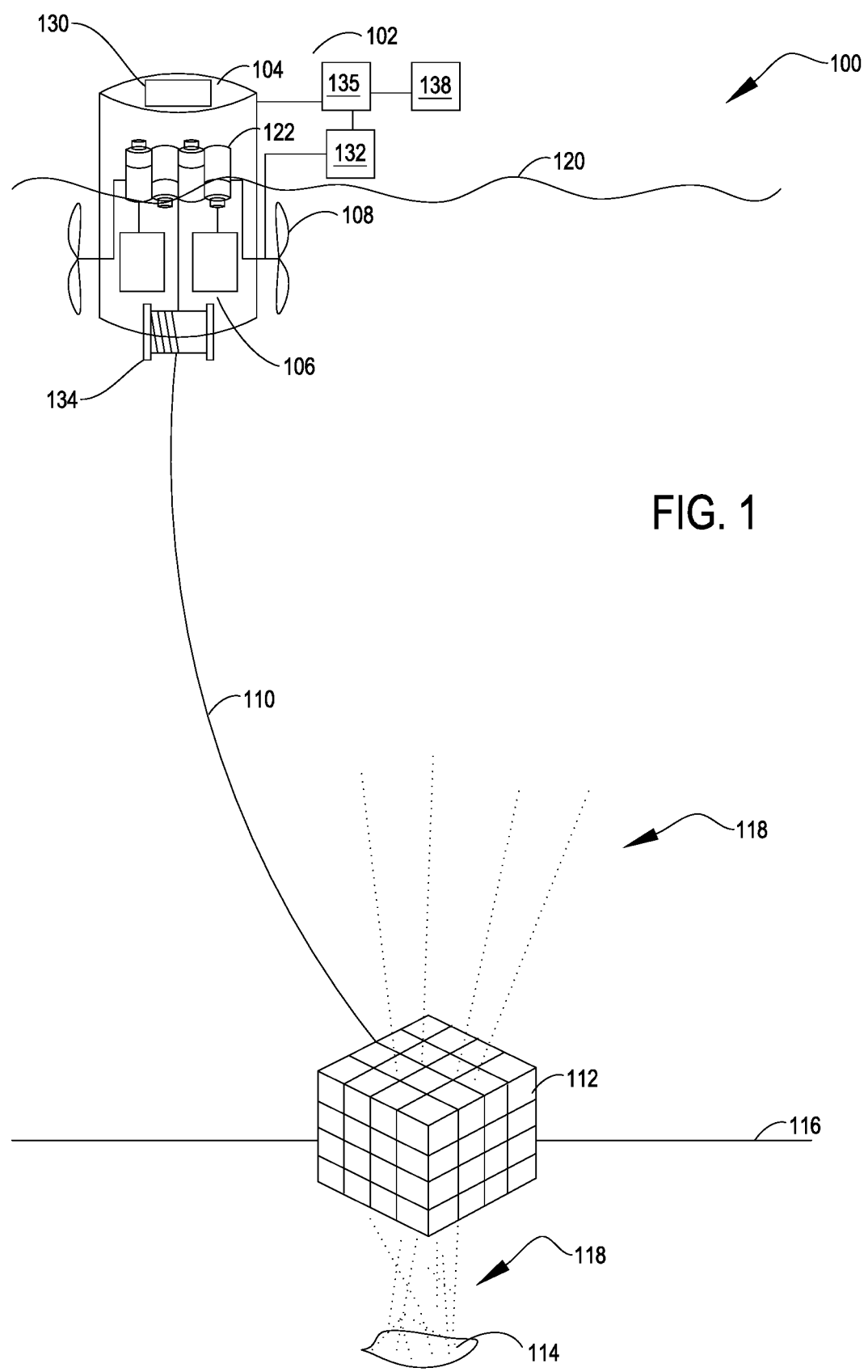
FIG. 1 shows an embodiment of a hydrothermal vent energy harvesting, storage, and power distribution system according to the present disclosure.

For example, as shown in a non-limiting embodiment of a system in FIG. 1, a thermal energy harvesting unit may be connected via a cable to a buoy at the ocean surface and strategically positioned near a vent for energy harvesting via the Seebeck effect. Energy harvested at the vent by the thermal harvesting unit can then be transferred via the cable to a bank of batteries within the buoy. In turn, the bank of batteries may be used to power docking stations housed within or coupled to the buoy under the ocean surface. In this way, UUVs can drive into the docking stations underwater without breaking the ocean surface, and minimal disruption occurs to the surrounding ecosystems as the system does not demand the vent be capped or otherwise blocked (e.g., the system is not maintained in a fixed location with secondary structures and may be suspended near the vent). Further, potential issues arising from corrosion and fouling can be minimized as the system does not include moving parts.

Figure 3:
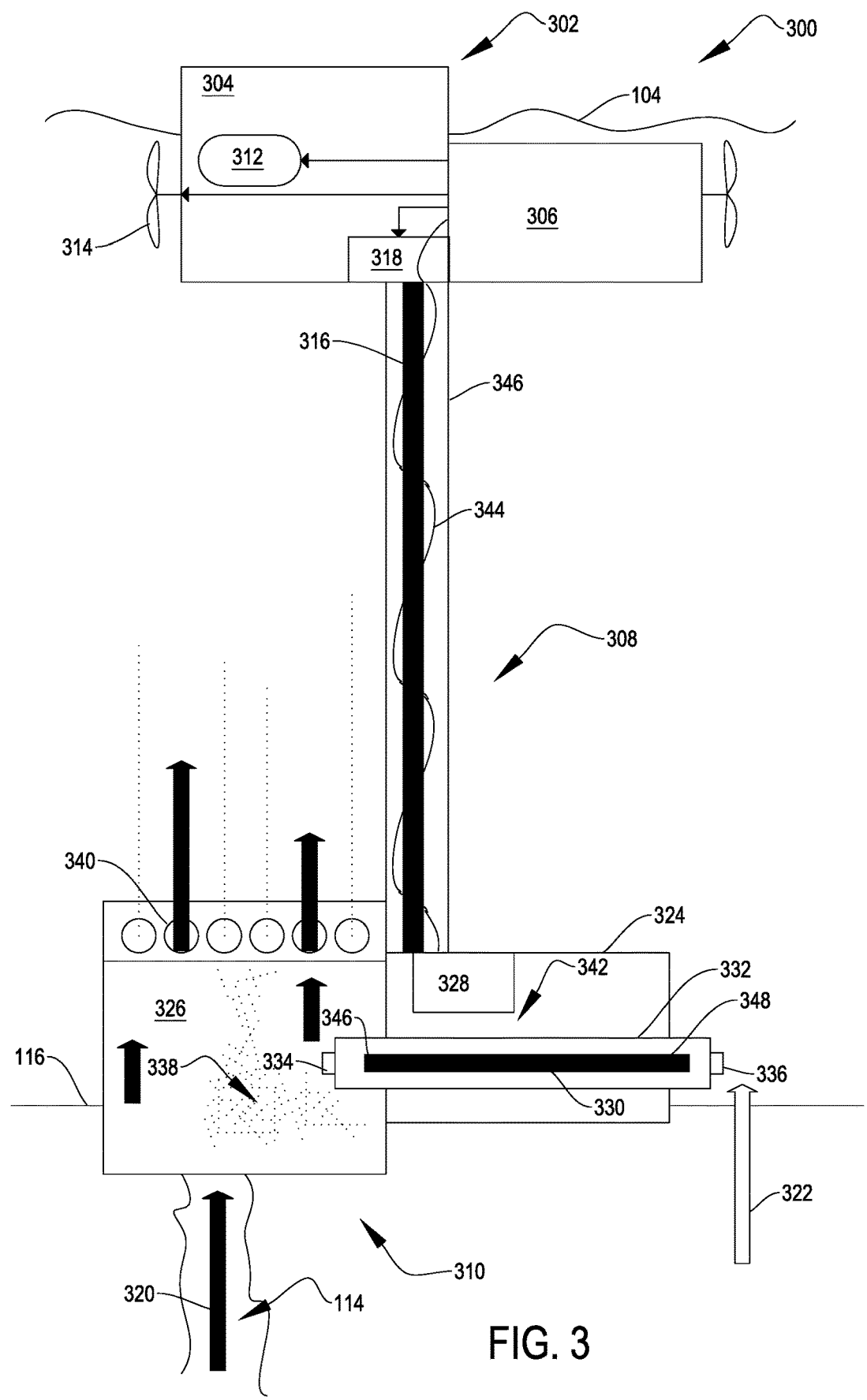
FIG. 3 shows a second embodiment of a hydrothermal vent energy harvesting, storage, and power distribution system.
Figure 4:
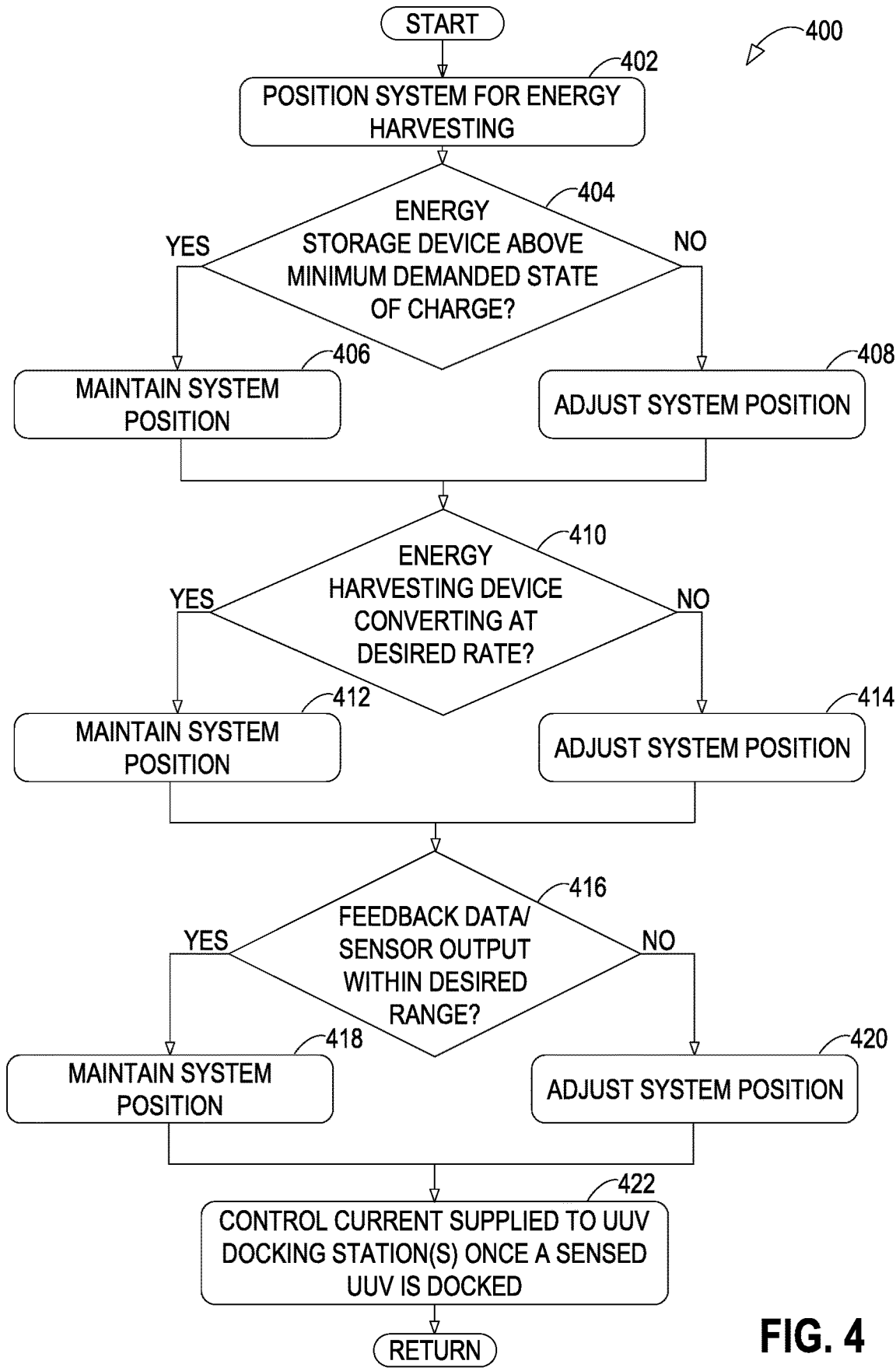
FIG. 4 is a flow chart of a method illustrating an example of a control method for the energy harvesting, storage, and power distribution systems described herein.

In another example, a thermal or thermoelectric energy harvesting unit can generate electricity using a simple heat engine positioned near the vent, with the generated electricity sent up to the ocean surface where it may be recovered and used to charge UUVs, such as shown in FIG. 3. Similar to the embodiment described above, the energy harvesting unit may be connected to a flotation device and energy storage device via a cable and electric wire, respectively. A non-limiting example of a method for controlling the systems described herein is illustrated in FIG. 4. By employing flotation devices and cables to suspend the energy harvesting units, the systems described herein may be set up relatively quickly over a thermal vent to begin generating power for vehicle operations (e.g., as the systems do not include stable structures). Further, the energy harvesting devices can be easily reeled in via the cable for periodic maintenance or replacement, as will be demanded by the harsh environment near the vent (e.g., temperature extremes, high acidity, increased prevalence of dissolved minerals and fouling, etc.). In this way, electric power may be generated for vehicles by harvesting energy from ocean thermal vents while minimally impacting the surrounding environment.

Turning now to FIG. 1, there is shown a first embodiment 100 of a hydrothermal vent energy harvesting, storage, and power distribution system 102 that may be used to generate power for UUVs or other suitable devices (e.g., aerial drones). The system 102 includes a buoy 104 housing a bank of batteries 122. The buoy 104 and the bank of batteries 122 are coupled to a thermal harvesting unit 112 via a cable 110. Generally, the thermal harvesting unit 112 can be strategically positioned above or near a hydrothermal vent 114 in the ocean floor 116 so that energy can be harvested from the vent 114 via the thermal harvesting unit 112. The energy harvested by the thermal harvesting unit 112 can then be transmitted to the bank of batteries 122 via the cable 110. Energy transmitted to the bank of batteries 122 can subsequently be used to provide power to coupled devices housed on, in, or coupled to the buoy 104. The bank of batteries 122 can be used to recharge coupled devices at or near the ocean surface 120 (e.g., within 100-50 feet of the ocean surface) using energy harvested from the vent 114 via thermal harvesting unit 112. For example, the bank of batteries 122 may be operatively coupled to a plurality of UUV docking stations 106 and a plurality of thrusters 108 physically coupled to the buoy 104. The plurality of UUV docking stations 106 may be used to recharge, charge, or otherwise provide power (e.g., to a coupled energy storage device or device) to one or more UUVs.

In some examples, the plurality of UUV docking stations 106 may be interspersed within an outer wall of the buoy 104 and positioned so as to be underwater when the buoy 104 is afloat within the ocean. For example, the plurality of UUV docking stations 106 may be comprised of underwater cavities within the outer surface of the buoy 104 spaced apart so that respective UUVs may be partially or fully inserted and operably coupled within all the docking stations comprising the plurality of UUV docking stations 106 (e.g., the plurality of UUV docking stations 106 may be suitably spaced apart so that each docking station may be simultaneously in use). For example, the outer surface of the buoy 104 may house two or more UUV docking stations. In some examples, the buoy 104 may only be coupled to one docking station to provide power to a larger-sized UUV or a UUV that demands all the power generated by the system 102.

In some examples, the plurality of UUV docking stations 106 may be suitably coupled to the buoy 104 so that the docking stations 106 are submerged below the ocean surface 120. For example, a ring comprised of docking stations (or another suitably arrangement of docking stations) may be coupled to a lower surface of the buoy 104 so that the ring is fully immersed within the ocean independent of buoy 104 movement. By positioning the plurality of UUV docking stations 106 underwater, a UUV may be driven directly into a docking station to be docked without breaking the ocean surface 120.

In some examples, the plurality of UUV docking stations 106 may be comprised of docking stations corresponding to one or more UUV models. For example, the plurality of UUV docking stations 106 may include four of the same type of docking station (e.g., four of the same model UUV may be simultaneously recharged at the plurality of UUV docking stations 106). Alternatively, the plurality of UUV docking stations 106 may include four individual types of docking stations. For example, a first docking station may correspond to a first type of a remotely operated underwater vehicle (ROUV), a second docking station may correspond to a second ROUV type, a third docking station may correspond to a first type of an autonomous underwater vehicle (AUV), and a fourth docking station may correspond to a fourth AUV model/type.

In some examples, the system 102 may be used to power other suitable devices. For example, system 102 may be adapted to include one or more additional docking stations that can be used to recharge aerial drones (e.g., the additional docking stations may be suitably coupled to outer surface of the buoy 104 not submerged below the ocean surface 120). Alternatively, system 102 may include an aerial drone docking station 130 on buoy 104 in addition to or instead of the plurality of UUV docking stations 106.

The plurality of thrusters 108 may also be powered by the bank of batteries 122. In some examples, the plurality of thrusters 108 may be used to position the thermal harvesting unit 112 at an operable position relative to the vent 114 or to maintain the relative position of the buoy 104 and all other components of the system 102 coupled to the buoy 104. In other words, the plurality of thrusters 108 may provide station-keeping so that the buoy 104 may not drift too far from the vent 114, where "too far" may be herein defined as any distance impeding functional operation of the system 102 (e.g., one meter, ten meters, twenty meters). In some examples, the system 102 can be actively and/or passively positioned using the plurality of thrusters 108. For example, the system 102 can be set to maximize power and control its own positioning via the plurality of thrusters 108.

In some examples, the plurality of thrusters 108 may be operatively and/or communicatively coupled to a remote or onboard global positioning system (GPS) 132. The GPS 132 may be used to selectively activate and/or position the plurality of thrusters 108 so that a set or determined position of the system 102 relative to the vent 114 may be maintained. Further, the GPS 132 and the plurality of thrusters 108 can be used move the system 102 to an initial energy harvesting position as well as shift the position of the system 102 to a new location and/or vent. The position of the system 102 may be shifted periodically (e.g., every five days, every two weeks, every month) to decrease potential environmental impact and/or in response to collected data from the surrounding environment.

For example, the system 102 can include a computing device 135 positioned in or coupled to the buoy 104. The computing device 135 may include a processor to receive input from a plurality of sensors, detectors, and/or samplers used to determine the environmental/ecological impact of maintaining the system 102 at a relative position over the vent 114 over time (e.g., microbial populations, flow rates, and/or biological populations may be monitored over time) and trigger various actuators in response to the processed input data based on instruction or code programmed therein corresponding to one or more routines. In one example, the computing device 135 may include an electronic controller. The computing device may be further coupled to the GPS system 132 operatively and/or communicatively linked to the plurality of thrusters 108. A radio receiver 138 may be positioned in or coupled to the computing device 135. As an example, the thrusters 108 may be controlled based on radio signals received by the radio receiver 138. In one example, the computing device may act on preprogrammed instructions to control at least one thruster to maintain a desired geographic position of the system and/or to adjust the position of the system in response to power generated.

Once a pre-determined threshold of ecological footprint of the system is reached or an impact determined, the GPS 132 and the plurality of thrusters 108 may be used to move the system 102 to a vent located well outside of the impacted area or to a vent that allows the system 102 to operate below the threshold level. Similarly, the system 102 may be relocated based on demand and/or to increase efficiency via the GPS 132 and the plurality of thrusters 108. For example, system use and demand may be tracked and the system 102 suitably relocated based on nearby vehicle activity (e.g., recharging demand) as well as vent locations using the GPS 132 and the plurality of thrusters 108. In some examples, a temperature-based positioning system may be employed to advantageously position the system 102 for energy harvesting from vents. The temperature sensing system could read temperatures at the thermal harvesting unit 112 to optimize positioning.

The number, size, shape, and positioning of the thrusters of the plurality of thrusters 108 may selected so that system 102 may be positioned and/or relocated as demanded (e.g., automatically, manually, via a communicatively coupled device) using the thrusters 108. Similarly, the size, shape, dimensions, and materials of the buoy 104 may be selected to house/be coupled to the bank of batteries 122, the plurality of thrusters 108, the plurality of UUV docking stations 106, and/or any other suitable or alternative device(s) that may comprise system 102 where the bank of batteries 122 may provide power to coupled devices.

For example, the plurality of thrusters 108 may be comprised of two hydraulic thrusters physically and operatively coupled to the buoy 104, the bank of batteries 122, a GPS system 132, and a computing device 135. In some examples, the system 102 may have more or fewer than two thrusters and/or the thrusters may not be hydraulic (e.g., electric thrusters). In some examples, the system 102 may include an additional or alternative suitable mechanism (e.g., in addition to or instead of the plurality of thrusters 108) that may be used to maintain position and/or relocate the thermal harvesting unit 112.

As previously described the bank of batteries 122 and the buoy 104 may be coupled to the energy harvesting unit 112 via the cable 110. The cable 110 may be comprised of suitable materials and dimensions (e.g., insulated copper wire), and may be coupled to the energy harvesting unit 112, the bank of batteries 122, and the buoy 104. For example, the cable 110 physically couples the buoy 104 to the energy harvesting unit 112 so that the cable 110 and the buoy 104 support the energy harvesting unit 112 as the energy harvesting unit 112 harvests energy from the vent 114 and is moved through/within the ocean. (e.g., the energy harvesting unit 112 is supported within the ocean by the cable 110 which is attached to the buoy 104 at the ocean surface 120.) The cable 110 is operatively coupled to the bank of batteries 122 and the energy harvesting unit 112 so that energy harvested by the energy harvesting unit 112 from the vent 114 is transferred to the bank of batteries 122 from the energy harvesting unit 112 via the cable 110. The length of the cable is suitable so that the energy harvesting unit 112 may maintain energy harvesting from the vent 114 or other hydrothermal vents while providing energy output to the bank of batteries 122 via the cable 110, the bank of batteries 122 simultaneously and/or later transmitting the energy to coupled devices at the ocean surface 120 (e.g., UUVs that demand recharging). The cable 110 is also suitable to withstand the movement of the ocean as well as the being continuously submerged within varying ocean water compositions (e.g., the hotter/acidic conditions near the vent, conditions near the ocean surface 120, debris, currents, etc.)

For example, as hydrothermal vents are typically located at depths of 2,500 meters, the length of the cable 110 may be at a minimum 2,500 meters so that the system 102 may be adapted for use with a range of different vents along the ocean floor 116. In some examples, the length of the cable 110 may be adjustable. For example, the cable 110 may be operatively coupled to a cable winch system 134 so that the energy harvesting unit 112 may be raised/lowered relative to the ocean surface 120 and/or the ocean floor 116, GPS signal input, temperature changes, ocean floor topology, and/or other suitable input that may be used to manually/automatically adjust the length of the cable 110 via the winch system. Further, the weight of the cable 110 may be such that a set length/depth (e.g., 2,500 meters) may be relatively maintained despite slow buoy speeds (e.g., due to currents).

For example, the cable 110 can be made of steel with a ¾" to 1" diameter and include conductors (e.g., twisted pairs, twisted quads, a coaxial cable) at the center. The steel cable may have a length and weight suitable to maintain an approximate 2,500-meter depth independent of typical ocean conditions and movement (e.g., density, currents). In some examples, energy may be harvested, stored, and distributed via the system 102 by generating power thermoelectrically using hydrothermal fluid 118/heat released from the vent 114 and the cable 110 suitably comprised to allow for such (e.g., the configuration of the cable 110 may correspond to that demanded by the system 102 so that the energy harvesting unit 112 may be suitably positioned to use hydrothermal fluid 118 or heat released from the vent 114 to generate mechanical and/or electrical energy that may be used to recharge UUVs).

In some embodiments, power may be generated by converting heat energy from the vent 114 into electric energy using the Seebeck effect. If two types of conductors (e.g., two dissimilar metals) are connected, the contacts between the two conductors kept at different temperatures, and one conductor disconnected, an electromotive force is generated between the disconnected terminals. The electromotive force generated between the two terminals is called the thermoelectromotive force, and this phenomenon is called the Seebeck effect. An example 200 of the Seebeck effect that may be employed by the energy harvesting unit 112 to provide power to the bank of batteries 122 is illustrated in FIG. 2.

As shown in the example 200, a first terminus 202 of a first type of conductive wire 204 (e.g., a constantan or alumel wire, a first metal) may be suitably connected (e.g., welded, soldered) to a first terminus 206 of a second type of conductive wire 208 (e.g., a copper, iron, or chromel wire, a second material with different conductive properties than the first metal) at a first contact 210 (e.g., junction). Similarly, a second terminus 212 of the first type of conductive wire 204 may be suitably connected to a second terminus 214 of the second type of conductive wire 208 at a second contact 216 (e.g., junction). Additionally, the second type of conductive wire 208 may be discontinuous, thereby forming terminals A and B.

The first contact 210 may be positioned/located in a "cold" region 218 away from the vent 114 whereas the second contact 216 may be may be positioned/located in a "hot" region 220 either directly in the flow of hydrothermal fluid 118 released from the vent 114 or near enough to the vent 114 where a voltage 222 may be generated across the disconnected terminals A and B (e.g., via the Seebeck effect). The positioning and location of the energy harvesting unit 112 may be such that the voltage 222 generated is at least sufficient to meet the power commands/demands of the system 102.

The generated voltage (V) 222 is related to the difference in temperature (ΔT) between the heated second contact 216 and the cooler first contact 210 by a proportionality factor (α) called the Seebeck coefficient, or V=αΔT. The Seebeck coefficient (e.g., thermoelectric sensitivity) of a material (e.g., the material comprising the second type of conductive wire 208) is a measure of the magnitude of an induced thermoelectric voltage in response to a temperature difference across that material, as induced by the Seebeck effect. The Seebeck coefficient is usually a nonlinear function of temperature. Thus, the energy harvesting unit 112 may be comprised of suitable materials and a corresponding configuration wherein the voltage 222 may be used to at least power the plurality of thrusters 108, the plurality of docking stations 106, and any onboard controls associated therewith demanding power. In some examples, another suitable energy conversion technique can be employed by the energy harvesting unit 112 to generate power thermoelectrically.

The voltage 222 generated by the by the energy harvesting unit 112 may then be sent up the cable 110 to the bank of batteries 122 powering the plurality of thrusters 108 and the plurality of UUV docking stations 106. Multiple circuits may be used for redundancy and/or to increase the amount of energy harvested (e.g., to meet real-time demand). As the system 102 only demands hot and cold junctions (e.g., a temperature difference between the first and second contacts 210, 212) between two dissimilar materials/metals, the vent 114 does not need to be capped or otherwise blocked for the system 102 to charge the bank of batteries 122.

The energy harvesting unit 112 may be positioned on (e.g., in partial face-sharing contact with) or above the ocean floor 116 near the vent 114 or a series of hydrothermal vents, with the positioning of the energy harvesting unit 112 optimized to cause minimal disruption to the surrounding ecosystems while meeting a power demand and/or command at the ocean surface 120. For example, the plurality of thrusters 108 and/or a winching system 134 coupled to the cable 110 may be used to periodically shift the location and/or position of the system 102 and/or energy harvesting system 112. In one example, the energy harvesting system 112 may be lowered near the vent 114 only when charging the bank of batteries 122 and/or during peak vehicle recharging hours and raised at all other hours. In another example, the timing of shifting the location and/or positioning of the system 102 and/or energy harvesting system 112 may be determined based on predicted environmental impact data and/or a vehicle location schedule. By following the vehicle location schedule, the system 102 may travel with the vehicles, acting as a temporary charging station.

In some examples, the weight, configuration, and/or dimensions of the energy harvesting unit 112 may be such that the force of the hydrothermal fluid 118 exiting the vent 114 may maintain the energy harvesting unit 112 in a suspended position above the ocean floor 116 so that the energy harvesting unit 112 may only be in contact with ocean water. For example, the energy harvesting unit 112 may be a caged box configured to hover over vents that have exiting jets of a pre-determined speed. In one example, the energy harvesting unit 112 may be a 12 ft. by 12 ft. caged box configured to hover 10-15 m above and/or adjacent to vents that have a strong jet and are approximately 2 ft. across and at least 3 ft. deep. In some examples, the system 102 may include rigid connections to the ocean floor 116.

Additionally, as the system 102 includes no moving parts potential issues (e.g., component degradation and/or decay) due to corrosion and fouling may be minimized, further reducing the environmental impact of the system 102 (e.g., less maintenance disruptions, less degradation debris released into the surrounding environment, etc.). Moreover, the system 102 may be easily maintained (e.g., as compared to stable structures) on-site (e.g., by reeling the energy harvesting unit 112 up to the ocean surface using a winch) and/or by relocating the system 102 to a convenient location for such using the plurality of thrusters 108. In some examples, the system 102 may include a camera that is used to visually determine the state of the system and/or the surrounding environment (e.g., to determine if the system 102 demands maintenance and/or is negatively impacting the area).

FIG. 3 shows a second non-limiting embodiment 300 of a hydrothermal vent energy harvesting, storage, and power distribution system 302 that may be used to generate power for UUVs or other suitable devices (e.g., aerial drones). The system 302 may be comprised of a flotation device 304 physically coupled to an energy storage device 306, with both devices 304, 306 located at or near the ocean surface 104 (e.g., within 50-100 feet of the ocean surface). Further, the system 302 may include a coupling mechanism 308 that physically and communicatively couples an energy harvesting unit 310 to the flotation device 304 and the energy storage device 306, respectively. The energy harvesting unit 310 may be strategically positioned near the vent 114 to provide a commanded and/or demanded power supply to the energy storage device 306 (e.g., the energy harvesting unit 310 may generate and supply electricity to the energy storage device 306 using heat energy released from the vent 114), with power transmitted from the energy harvesting unit 310 to the energy storage device 306 via the coupling mechanism 308. The energy storage device 306 may be configured to distribute electrical power to UUVs, UUV docking stations, and other communicatively/operatively coupled devices.

In some examples, the energy storage device 306 may be coupled/provide power to a camera 312 housed within the flotation device 304 (e.g., a buoy) as well as a plurality of thrusters 314. The plurality of thrusters 314 may be suitably coupled to the system 302 so that the thrusters may be used to position the energy harvesting unit 310 as well as the system 302 relative to the vent 114. One or more thrusters (e.g., hydraulic, electric) comprising the plurality of thrusters 314 may be coupled to the outer surface(s) of the flotation device 304 and/or the energy storage device 306. In some examples, thrusters may be located on the energy harvesting unit 310 as well or instead of the flotation device 304 and/or the energy storage device 306.

In some examples, the camera 312 and the plurality of thrusters 314 may be communicatively coupled to a positioning system (e.g., onboard and/or remote). The camera 312 may provide visual data to the positioning system which may be used as feedback for changing/maintaining the position of the system 302 and/or energy harvesting unit 310 via the plurality of thrusters 314 (e.g., the thruster speed, direction, angle may be adjusted to maintain or reach a location). In some examples, the system 302 may not include the camera 312 or the camera 312 may be otherwise suitable positioned (e.g., the camera 312 may extend from the energy storage device 306 or be coupled to/suitably housed within the energy harvesting unit 310).

Once the system 302 is in a designated location at the ocean surface 104, the coupling mechanism 308 and the plurality of thrusters 314 may be used to maintain the energy harvesting unit 310 at an efficient energy harvesting position relative to the vent 114. In some examples, the coupling mechanism 308 may be comprised of a cable 316 coupled to a winch 318 and the energy harvesting unit 310. The winch 318 may be housed within the flotation device 304 and manually and/or electrically powered via the energy storage device 306. The winch 318 may be used to raise and lower the energy harvesting unit 310 relative to the flotation device 304 or other objects/locations with the aid of the camera 312 and/or plurality of thrusters 314. In some examples, the winch 318 may be otherwise suitably located (e.g., outside of the flotation device 304). In some examples, the system 302 may not include the winch 318 (e.g., the cable 316 may be directly coupled to the flotation device 304 and the energy harvesting unit 310). In some examples, the coupling mechanism 308 may be comprised of another suitable mechanism for raising/lowering/positioning the energy harvesting unit 310 (e.g., the mechanism 308 may be comprised of weights and pulleys, the cable 316 may coil and uncoil).

The energy harvesting unit 310 may be a thermal or thermoelectric system that uses the temperature difference between a hot flow 320 from the vent 114 and an ambient cold flow 322 (e.g., cold relative to the temperature of the hot flow 320) to generate electricity that may be transferred to the energy storage device 306. Given the potential for such a large temperature difference between the hot flow 320 and the cold flow 322, the theoretical (e.g., Carnot) efficiency of such a system may be significant.

In some examples, the energy harvesting unit 310 may be comprised of a thermal conversion unit 324 coupled to an electric generator 328 and a vent cover 326 that effectively positions the thermal conversion unit 324 in close proximity to the vent 114. The thermal conversion unit 324 may be a thermal engine, such as a heat engine comprised of a valve and piston unit 342 configured to be exposed to the hot flow 320 and the cold flow 322. This heat engine can be a single phase heat engine such as a Stirling engine or a phase change heat engine such as a Rankine or regenerating engine. The vent cover 326 may be configured to generate steam 338 (using the hot flow 320 from the vent 114) that may be introduced into an ambient pressure cylinder 332 of the unit 342, with the steam 338 used to drive a piston 330 housed within the cylinder 332 to produce mechanical energy. The mechanical energy produced may be converted to electrical energy via the generator 328 and electrical energy from the generator 328 transmitted to the energy storage device 306 via a wire 344. Thus, the thermal conversion unit 324 may be configured to operate at depth pressure or be completely sealed. If sealed, the thermal conversion unit 324 may additionally include a heat exchanger to cool the working ambient fluid before it enters the cylinder 332 at the start of a cycle.

The vent cover 326 may be configured so as to not to significantly restrict the flow of the vent 114 (e.g., cause limited disruption to the surrounding environment/ecosystem). In some examples, the vent cover 326 may include a plurality of passages and/or openings 340 that the hot flow 320 from the vent 114 may pass through. Steam 338 generated within the vent cover 326 may also exit via the plurality of passages and/or openings 340 as well as through a first valve 334 operatively coupled to the cylinder 332. In some examples, steam 338 may be generated and fed into the cylinder 332 by the first valve 334 or a device coupled to the first valve 334 (e.g., the vent cover 326 may not be configured to generate steam 338). In some examples, the hot flow 320 may be a direct working fluid of the (e.g., instead of steam 338 produced from the hot flow 320) of the thermal conversion unit 324.

The first valve 334 may be positioned near a first end 346 of the piston 330 and a second valve 336, also operatively coupled to the cylinder 332, positioned near a second end 348 of the piston 330. Further, the second valve 336 may be located within the cold flow 322 so that the cold flow 322 may be used as a working fluid for the unit 342. Thus, the first and second valves 334, 336 may use the temperature difference between the hot and cold flows 320, 322 to slide the piston 330 back and forth by adjusting the pressure within the cylinder 332 thereby creating mechanical output.

The first and second valves 334, 336 may be communicatively coupled to a control mechanism (e.g., a passive and/or active mechanism comprising pressure/temperature/energy output/other sensors) so that the valves 334, 336 are controlled (e.g., based on commanded and/or demanded power distribution from the system 302) to selectively adjust the mechanical output (e.g., the rate of piston movement) of the unit 342. The mechanical output may then be converted to electrical energy via the generator 328 and transmitted from the generator 328 to the energy storage device 306 via the wire 344.

In some examples, the wire 344 may be attached to the cable 316. For example, the wire 344 may be fixedly wrapped around the cable 316, with both the cable 316 and wire 344 enclosed within a suitable casing 346 (e.g., loom tubing, a braided sleeve). Alternatively, the wire 344 may be physically coupled to a side surface of the cable 316. In some examples, the wire 344 may be integral to the cable 316 (e.g., the wire 344 may comprise the center of the cable 316). In some examples, the system 302 may not include the casing 346. In some examples, the thermal conversion unit 324 may contain more than one piston, cylinder, and/or valve set. In some examples, other variants of existing thermal engines operating between cold and hot reservoirs may be used in the embodiment 300 and/or other embodiments according to the present disclosure.

FIG. 4 is a flow chart of a non-limiting example of a control method 400 for an energy harvesting, storage, and power distribution system according to the embodiments described herein. Instructions for carrying out method 400 may be executed by a controller (e.g., remote, onboard) communicatively coupled to the system (e.g., system 102, system 302) based on instructions stored on a memory of the controller and in conjunction with signals/data received from the system (e.g., temperature sensor data, power output, battery state of charge). The system may be generally comprised of a positioning system (e.g., camera 312 and plurality of thrusters 314 of FIG. 3), an energy harvesting device/unit (e.g., energy harvesting unit 112 of FIG. 1, energy harvesting unit 310 of FIG. 3) a flotation device (e.g., buoy 104 of FIG. 1, flotation device 304 of FIG. 3), an energy storage device (e.g., bank of batteries 122 of FIG. 1, energy storage device 306 of FIG. 3), and a cable (e.g., cable 110 of FIG. 1, cable 316 of FIG. 3).

At 402, method 400 may position the system for energy harvesting using the positioning system. The positioning system may include a camera and a plurality of thrusters. As previously described, the plurality of thrusters may be manually and/or automatically controlled so as to get the system to an initial energy harvesting position and/or maintain the system at a current energy harvesting position. For example, thrusters located on the flotation device and/or energy storage device may be used to locate and maintain the system at the initial energy harvesting position (e.g., where the flotation device is located above a vent suitable for energy harvesting via the system). Further, thrusters attached to the energy harvesting device may be used to maintain the location thereof near a vent so that the energy harvesting device may convert hydrothermal energy from the vent as demanded by the system. The position of the energy harvesting device, the floatation device, and/or other components comprising the system may be determined using visual data from the camera, echo sounding, GPS tracking data, and/or other suitable techniques.

Further, data from the camera may be used to track potential effects of the system(s) on the surrounding environment over time (e.g., thermal and visual image comparisons to controls over time). In some examples, the camera may be used to assess the current condition of the system. If a visual assessment indicates the system demands maintenance, the thrusters may be used to suitably relocate the system (e.g., to a repair docking station, to a nearby water vehicle, close to a shore) as demanded.

In some examples, the energy harvesting position of the system may be determined based on the previous energy harvesting position of the system, the energy harvesting positions of similar/additional deployed systems, the energy demands of the system, the location of a fleet of UUVs relative to a suitable vent, the length of time the system has been deployed and/or near a vent. For example, the system may be periodically relocated to track a UUV fleet(s), limit environmental impact (e.g., the system may only harvest energy from any one vent for two weeks straight, the system may follow a cyclical route of designated vents within a designated time frame).

The system may be suitably positioned for energy harvesting so that the energy harvesting device is efficiently outputting a demanded power to the energy storage device by converting thermal energy from the vent. For example, if the energy harvesting device employs the Seebeck effect (e.g., energy harvesting device 112 of FIG. 1), the thrusters may be used to maintain a first or first set of thermocouples at a "hot" temperature and a second or second set of thermocouples at a "cold" temperature. The "hot" temperature thermocouples may be positioned in the exiting flow of the vent and the "cold" temperature thermocouples may be positioned in an ambient flow. Operation of the thrusters may be selectively adjusted (e.g., based on the temperature of the thermocouples, vent flow, ocean currents) so that the greatest temperature difference possible is maintained between the "hot" temperature thermocouples and the "cold" temperature thermocouples and, thus, the largest energy output from the energy harvesting device.

In another example, the energy harvesting device may employ a thermodynamic system such as a Stirling engine to generate mechanical energy that is converted into electrical via a generator (e.g., system 302). The thrusters may be used to maintain/position a first end of the engine within the hot flow from the vent and a second end of the engine within surrounding ambient water. The temperature difference between the first and second ends of the engine may be used to drive a piston and thereby power the generator. Thus, data from the camera, pressure, temperature and/or other sensors may be used to adjust and determine the relative position and orientation of the energy harvesting device so that the system efficiently meets a demanded energy output and causes minimal disruption to the surrounding environment.

At 404, method 400 may determine if the energy storage device is at or above a minimum demanded state of charge (SOC). For example, the system may be set so that that energy harvesting device maintains a bank of batteries at a 60% SOC or greater at all times. In some examples, the system may be set so that the energy storage device maintains several minimum SOCs based on the current condition(s). For example, the system may be set to maintain the bank of batteries at a 30% minimum SOC at when one or more UUVs are being re-/charged by the bank of batteries and a 70% or greater SOC at all other times.

If the energy storage device is at least at a minimum demanded SOC, the position of the system may be maintained at 406. The position of the system may include the position of the flotation device, the energy storage device, the cable, and/or the energy harvesting unit. The position of the system may be maintained via the plurality of thrusters. For example, the thrusters may be used to maintain the relative position of the flotation device (e.g., buoy 104 of FIG. 1) to the energy harvesting device so that the position of the energy harvesting device does not shift relative to the vent and stress on the cable is limited. If the energy storage device is not at a minimum demanded SOC, the position of the system may be adjusted at 408. The position of the system may be adjusted so energy storage device meets or exceeds the minimum SOC.

Adjusting the system position may include relocating the system to a different vent or a different area (e.g., outside of a 50-meter diameter from the current vent), shifting the system to a new suitable vent within the same area (e.g., within 50 meters of the current vent), and/or shifting the position and/or orientation of part of the system relative to the vent using the positioning system. For example, the plurality of thrusters, GPS, and a thermal map of ocean vents may be used to re-locate the system for more efficient energy harvesting based on energy demand (e.g., UUV fleet locations) and the temperature environments of nearby vents. In another example, the position of the energy harvesting device may be adjusted relative to the vent so that the temperature difference between the hot flow from the vent and the surrounding ambient flow is more may be efficiently/effectively exploited by the energy harvesting device.

At 410, method 400 may determine if the energy harvesting device is converting vent energy at a desired rate. For example, voltage, current, and temperature sensors may be used to determine the electrical output of the system and compare it to a desired output. The desired output may be a rate within an average range based on the system configuration and temperatures encountered near the vent. Alternatively, the desired rate may be at or near the highest theoretical output for the system based on the surrounding temperature conditions. If the energy harvesting device is converting vent energy at a desired rate, the position of the system may be maintained at 412. The position of the system may include the position of the flotation device, the energy storage device, the cable, and/or the energy harvesting unit. The position of the system may be maintained via the plurality of thrusters and/or other components of the positioning system.

If the energy harvesting device is not converting vent energy at a desired rate, the position of the system may be adjusted at 414 so that the energy harvesting device may operate at the desired rate. For example, the positioning system (e.g., the cable, the camera, the plurality of thrusters) may be used to adjust the orientation and/or position of the energy harvesting unit relative to the hot flow from the vent to increase the energy conversion rate of the system (e.g., the energy harvesting unit may be lowered/raised and/or the angle or position of the energy harvesting unit may be adjusted/rotated relative to the vent to maximize the energy output from the system). In some examples, the position of the energy harvesting unit and/or other system components may be adjusted to overcome debris or other environmental objects interfering with the conversion rate of the energy harvesting unit.

At 416, method 400 may determine if feedback data and/or sensor output is within a desired range. The desired range for the data and output may be that where the system may operate as demanded (e.g., provide demanded power to coupled devices, such as recharging UUVs, within a designated time frame) and be useful (e.g., be positioned where power is demanded). The feedback data and sensor output may be used to determine the effectiveness of deployment of the system within different designated areas, the efficiency of the system, the environmental impact of the system and maintain or adjust the position of the system accordingly.

The feedback data may include data used to track and predict the environmental impact of the system over time, the energy distribution of the system relative to time spent near the vent/deployed, the efficiency of the system, maintenance data, and so on. For example, feedback data may determine the system is out of a desired range to be useful for re-charging by the nearest UUV fleet. In another example, feedback data may indicate that the ecological footprint of the system is outside of a desired range (e.g., the system may be impacting the surrounding environment by exceeding one or more thresholds). Feedback data may include the time of system deployment and how long the system has spent at each vent, data from the camera, an analysis of microbial/water samplings near the system over time, how often the system is repaired and what is repaired, etc.

The system may also include one or more sensors such as pressure sensors, temperature sensors, flow and level sensors (e.g., a Hall-effect sensor), electrical sensors, and/or other suitable sensors. Sensor output may be used to determine how effectively the system is operating relative to a theoretical output (e.g., based on the configuration of the energy harvesting device, the hot and ambient flow temperatures and flow rates, etc.). For example, the energy harvesting device may employ hot and cold thermocouples between two different conductive materials to generate electricity. Temperature sensors may be used to determine if the cold thermocouples are within a desired "cold" temperature range and/or of the hot thermocouples are within a desired "hot" temperature range, with the desired ranges determined based on a maximum efficiency (e.g., highest energy output) for the system. Similarly, pressure sensors may be used to determine if an energy harvesting device that employs a pressure driven piston system is operating efficiently/within a desired range.

If the feedback data/sensor output is within a desired range, method 400 may maintain the position of the system at 418 (e.g., via the positioning system). If the feedback data/sensor output is outside of a desired range, the position of the system may be adjusted at 420 (e.g., via the positioning system). For example, the actual electrical output values (e.g., current, voltage) of the system may be outside of a desired range of theoretical values. Thus, the position of the system may be adjusted to bring the electrical output values within the desired range. In another example, temperature sensor output may be used to determine that the energy harvesting unit may be otherwise positioned for more efficient energy harvesting and adjusted as such. In another example, the system may be re-located to be useful based on feedback data (e.g., the system may be positioned closer to a deployed UUV fleet). In another example, the system position may be periodically adjusted based on feedback data (e.g., the system may be relocated to a new vent at least 100 meters away every three weeks to reduce environmental impact).

At 422, the current supplied to a UUV docking station may be controlled once a sensed UUV is docked. In some examples, the UUV may be sensed via sensors (e.g., visual, laser, and/or scanning sensors) and/or a physical mechanism upon docking (e.g., a button, clip, panel, etc. of the UUV docking station may be pressed inward or outward when the UUV is docked). In some examples, the energy storage device may supply a constant voltage to the docking station and the docking station may cap the voltage supplied to the UUV when a set limit/threshold is reached. In some examples, the plurality of docking stations may be configured to automatically release a docked UUV once the UUV has been fully charged or charged a demanded amount. Power/current supplied to the UUV may be based on communicated request, such as a wireless or wired transmission, sent from the UUV to the docking station, such as via a connection, and/or based on the system sensing battery voltage of the UUV.

In this way, the systems described herein may be used to generate electric power for UUVs and other suitable devices by harvesting the energy from an ocean thermal vent without capping the vent. A thermal and/or thermoelectric energy harvesting device may harvest energy from the vent while suspended, via a cable, from a flotation device at the ocean surface. The cable or a wire attached to the cable may transmit energy from the energy harvesting unit to an energy storage device housed within and/or coupled to the flotation device. The energy harvesting unit may employ the Seebeck effect to generate power or a thermal and/or thermoelectric engine. Thus, the system may be easily maintained (e.g., by reeling up the energy harvesting unit and/or relocating the system) as it may include limited or no moving parts. Further, the system may be easily relocated and quickly placed into operation as the system does not demand any stable structures for operation. As such, the vent and the surrounding area may be minimally disturbed. Moreover, predicted ecological disruption may be tracked by the system (e.g., using camera and sensor data) and the system may shift positions/be relocated before any significant predicted impact occurs. The technical effect of using the systems described herein to re-/charge UUVs is that the system may be quickly deployed as demanded by a UUV fleet.

As one embodiment, a hydrothermal vent energy harvesting, storage, and distribution system comprises a flotation device coupled to an energy storage device, the flotation device and energy storage device located at or near an ocean surface (e.g., within 100-50 feet of the ocean surface). The system further comprises an energy harvesting unit coupled to the flotation device and the energy storage device via at least a cable, the energy harvesting unit positioned near a hydrothermal vent during energy harvesting, and a positioning system. The energy harvesting unit may be a thermal conversion unit of a thermoelectric system configured to convert thermal energy into electrical energy when positioned near the vent, the electrical energy transmitted to the energy storage device at the ocean surface via the cable or a wire. In some examples, the energy storage device may be coupled to the positioning system and to one or more docking station configured to charge unmanned underwater vehicles (UUVs).

FIGS. 1-3 shows an example configuration with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

It will be appreciated that the configurations and routines disclosed herein are exemplary in nature, and that these specific embodiments are not to be considered in a limiting sense, because numerous variations are possible. Moreover, unless explicitly stated to the contrary, the terms "first," "second," "third," and the like are not intended to denote any order, position, quantity, or importance, but rather are used merely as labels to distinguish one element from another. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. An energy harvesting system positionable at an ocean surface to harvest energy from a hydrothermal vent surrounded by cooler ocean water comprising:
   an energy storage device positionable proximate to the ocean surface;
   an electrically conducting cable joined to said energy storage device;
   an energy harvesting structure joined to said cable for providing electrical energy thereto, said energy harvesting structure being positionable proximate to the hydrothermal vent; and
   wherein said energy harvesting structure is a thermal conversion system configured to convert thermal energy into electrical energy when positioned between the hydrothermal vent and cooler ocean water.

2. The system of claim 1, further comprising:
a buoyant device joined to said energy storage device for supporting said energy storage device proximate to the ocean surface; and
a winch joined to said buoyant device and operatively joined to said cable, said winch being capable of winding said cable in order to vertically position said energy harvesting structure.

3. The system of claim 2, further comprising:
a positioning system having at least one thruster joined to said buoyant device; and
at least one docking station joined to said buoyant device and configured to charge an unmanned underwater vehicle.

4. The system of claim 3, wherein said positioning system comprises a plurality of thrusters and a GPS control system, said plurality of thrusters being controlled based on GPS signals received by said GPS control system.

5. The system of claim 2, wherein said energy harvesting structure further comprises a vent cover configured to capture heat from the hydrothermal vent, a thermal conversion unit coupled to the vent cover and cooler ocean water to produce mechanical energy, and an electric generator joined to the thermal conversion unit to produce electrical energy from mechanical energy, the electric generator coupled to said cable.

6. The system of claim 5, wherein the thermal conversion unit is a heat engine utilizing the Stirling cycle.

7. The system of claim 5, wherein the vent cover is configured to capture a hot flow from the hydrothermal vent to generate steam; and the thermal conversion unit is a heat engine utilizing the Rankine cycle.

8. The system of claim 3, wherein said positioning system comprises a plurality of thrusters and a radio receiver, said plurality of thrusters being controlled based on radio signals received by said radio receiver.

9. A hydrothermal vent energy system comprising:
an energy harvesting unit configured to harvest energy between a hydrothermal vent and cooler ambient ocean water to provide electrical energy;
a cable joined to said energy harvesting unit to receive electrical energy;
a buoy joined to said cable;
a bank of batteries positioned in said buoy and joined to receive electrical energy from said cable;
at least one thruster joined to said buoy and said bank of batteries; and
a plurality of docking stations arranged on said buoy and joined to said bank of batteries.

10. The system of claim 9, wherein said energy harvesting unit comprises a thermoelectric device to harvest electrical energy via the Seebeck effect using a temperature differential between the hydrothermal vent and cooler ambient ocean water.

11. The system of claim 9, further comprising a computing device joined to said at least one thruster wherein said computing device can provide control signals to said at least one thruster to position and relocate the buoy.

12. The system of claim 11, wherein said computing device acts on preprogrammed instructions to control said at least one thruster.

13. The system of claim 11, further comprising a radio receiver positioned in said buoy and joined to said computing device wherein said computing device acts on received instructions to control said at least one thruster.

14. The system of claim 9, wherein:
said plurality of docking stations are UUV docking stations and are positioned at a region of said buoy that will be maintained underwater when the system is deployed in an aquatic environment; and
further comprising a power controller joined between said bank of batteries and said plurality of docking stations, said power controller being provided to control current supplied to a docking station once a vehicle is docked.

15. The system of claim 11, wherein said computing device is configured to control said at least one thruster to maintain a desired geographic position of the system and to adjust the position of the system in response to electrical energy received from said cable.

16. A method of providing an energy distribution system to utilize energy from a hydrothermal vent comprising the steps of:
positioning a flotation device proximate an ocean surface;
suspending a thermoelectric energy harvesting unit from a cable joined to the flotation device;
harvesting energy utilizing the thermoelectric energy harvesting unit;
storing harvested energy from the thermoelectric energy harvesting unit at a battery positioned in the floatation device;
docking vehicles at the floatation device; and
providing stored energy to said docked vehicles.

17. The method of claim 16, wherein the positioned flotation device has at least one thruster thereon, and further comprising the step of maintaining a geo-position of the thermoelectric energy harvesting unit.

18. The method of claim 16, further comprising the step of controlling the amount of stored energy supplied to said docked vehicles during the step of providing stored energy.

* * * * *